United States Patent [19]
Yang et al.

[11] Patent Number: 5,135,908
[45] Date of Patent: Aug. 4, 1992

[54] METHOD OF PATTERNING SUPERCONDUCTING FILMS

[75] Inventors: Edward S. Yang, Armonk; Qiyuan Y. Ma, New York, both of N.Y.

[73] Assignee: The Trustees of Columbia University in the City of New York, New York, N.Y.

[21] Appl. No.: 391,109

[22] Filed: Aug. 7, 1989

[51] Int. Cl.$^5$ .......................... C23C 1/04; B05D 3/06; H01L 21/28
[52] U.S. Cl. .......................................... 505/1; 427/62; 427/63; 437/189; 505/703; 505/706
[58] Field of Search ............... 505/701, 702, 703, 706, 505/725, 730, 731, 732, 739, 815, 818, 819, 820, 821, 826, 833, 856, 873, 918, 919, 920, 922, 923; 437/189; 427/62, 63

[56] References Cited

U.S. PATENT DOCUMENTS

| | | | |
|---|---|---|---|
| 4,316,785 | 2/1982 | Suzuki et al. | 427/63 |
| 4,900,709 | 2/1990 | Heijman et al. | 427/62 |
| 4,963,523 | 10/1990 | Ekin et al. | 505/706 |
| 5,015,620 | 5/1991 | Ekin et al. | 505/706 |

OTHER PUBLICATIONS

Ma et al., "Novel Method of Patterning YBaCuO Superconducting Thin Films", Appl. Phys. Lett., vol. 55, No. 9, Aug. 28, 1989, pp. 896-898.
Gurvitch et al., "Preparation and Substrate Reactions of Superconducting Y-Ba-Cu-O Films", Appl. Phys. Lett., vol. 51, No. 13, Sep. 28, 1987, pp. 1027-1029.
Gao et al., "Interface Formation: High Temperature Superconductors With Noble Metals, Reactive Transition Metals, and Semiconductors", Am. Vacuum Society Series 3, Nov. 6, 1987, pp. 358-367, AIP Conference Proceedings, No. 165.
Ehrlich et al., "Laser Chemical Technique for Rapid Direct Writing of Surface Relief in Silicon", Appl. Phys. Lett. vol. 38, No. 12, is Jun. 1981, pp. 1018-1020.
Ma et al., "High Tc Superconducting Thin Films by Rapid Thermal Annealing of Cu/BaO/Y$_2$O$_3$ Layered Structures," Appl. Phys. Lett., vol. 53, No. 22, Nov. 28, 1988, pp. 2229-2231.
Superconductivity at 93K in a New Mixed-Phase Y-Ba-Cuo Compound System at Ambient Pressure, M. K. Wu, et al., Phys. Rev. Lett. 58, p. 908 (1987).
Reproducible technique for fabrication of thin films of high transition temperature superconductors, P. M. Mankiewich et al., Appln. Phys. Lett. 51, p. 1753 (1987).
Growth, patterning, and weak-link fabrication of superconducting YaBa$_2$Cu$_3$O$_{7-x}$ thin films, G. C. Hilton et al., Appln. Phys. Lett. 51, p. 1107 (1988).
Quantum interference devices made from superconducting oxide thin films, R. H. Koch et al., Appln. Phys. Lett. 51, p. 200 (1987).

(List continued on next page.)

Primary Examiner—Olik Chaudhuri
Assistant Examiner—M. Wilczewski
Attorney, Agent, or Firm—Brumbaugh, Graves, Donohue & Raymond

[57] ABSTRACT

In a method of patterning superconducting thin films such as YBaCuO, based on the inhibition of superconductivity by intermixing an impurity, such as silicon, with superconductor material, a thin film of silicon is formed on a magnesium oxide substrate and then patterned, by laser direct-writing for example, to correspond to a desired pattern of superconducting lines. Multilayered YBaCuO thin films are then deposited over the patterned silicon film and annealed using rapid thermal annealing at a temperature of 980° C. maintained for a period in the range from 30 to 90 seconds. The rapid annealing results in intermixing of silicon and YBaCuO in regions of the film between the lines of the pattern which, in turn, causes these regions to become insulating, and at the same time causes the YBaCuO film over the line pattern to become superconducting. The principles of the method can be used to make superconducting interconnects as electrodes of semiconductor devices, and also to replace metal interconnects in semiconductor integrated circuits with superconducting interconnects.

6 Claims, 7 Drawing Sheets

OTHER PUBLICATIONS

Reactive ion beam etching of Y-Ba-Cuo superconductors, S. Matsui et al., Appl. Phys. Lett. 52, p. 69 (1988).

High transition temperature superconducting thin films in-situ growth, processing and properties, D. K. Lathrop et al., presented in Proc. SPIE. Int. Soc. Opt. Eng. (USA), 947, p. 124 (1988).

Use of Ion beams to decompose metalorganics into patterned thin-film superconductors, J. V. Mantese et al., Appl. Phys. Lett. 52, p. 1721 (1988).

Ion beam patterning of spin-on metalorganic percursors and formation of high $T_c$ superconductors, M. E. Gross et al., Appl. Phys. Lett 53 p. 802 (1988).

Use of electron beam lighography to selectively decompose metalorganics into patterned thin-film superconductors, J. V. Mantese et al., Appl. Phys. Lett. 53, p. 526 (1988).

Preparation and substrate reactions of superconducting Y-Ba-Cu-O films, M. Gurvitch et al., Appl. Phys. Lett. 51, p. 1027 (1987).

Chemical Etching of High-$T_c$ Superconducting Y-Ba-Cu-O Films in Phosphoric Acid Solution, Yugi Yoshizako et al., Jpn. J. Appl. Phys 26, p. L1533 (1987).

Chemical etching of Y-Cu-Ba-O thin films, I. Shih et al., Appl. Phys. Lett. 52, p. 1523 (1988).

Direct laser writing of superconducting patterns of $YBa_2Cu_3O_{7-x}$, Arunava Gupta et al., Appl. Phys. Lett., 52, p. 665 (1988).

Selective laser pyrolysis of metalorganics as a method of forming patterned thin-film superconductors, J. V. Mantese et al., Appl. Phys. Lett., 53, p. 1335 (1988).

Water interaction with the superconducting $YBa_2Cu_3O_7$ phase M. F. Yan et al., Appl. Phys. Lett. 51, p. 532 (1987).

Pulsed laser etching of high $T_c$ superconducting films, Arun Inam et al., Appl. Phys. Lett. 51, p. 1112 (1987).

Magnetron sputtering and laser patterning of high transition temperature Cu oxide films, M. Scheuermann et al., Appln. Phys. Lett 51, p. 1951 (1987).

Micropatterning of high $T_c$ films with an excimer laser, J. Mannhart et al., Appl. Phys. Lett. 52, p. 1271 (1988).

Laser Patterning of Metal Oxide Superconductor Films by Reactive Solid-State Transformation, M. Rothschild et al., IEEE, Electron Device Letters, 9, p. 57 (1988).

Laser chemical technique for rapid direct writing of surface relief in silicon, D. J. Ehrlich et al., Appl. Physl. Lett., 38, p. 1018 (1981).

Rapid direct writing of high-aspect-ratio trenches in silicon, G. V. Treyz et al., Appl. Phys. Lett. 50, p. 475 (1987).

High $T_c$ superconducting thin films by rapid thermal annealing of $Cu/BaO/Y_2O_3/Ag$ layer structures, Chin-An Chang et al., Appl. Phys. Lett. 53, p. 916 (1988).

High $T_c$ superconducting thin films by rapid thermal annealing of $Cu/BaO/Y_2O_3$ layered structures, Q. Y. Ma et al., Appl. Phys. Lett., 53 p. 2229 (1988).

Critical-Current Measurements in Epitaxial Films of $YBa_2Cu_3O_{7-x}$ Compound, P. Chaudhari et al., Phys. Rev. Lett., 58, p. 2684 (1987).

Interdiffusion Between Si Substrates and YBaCuO Films, Q. Y. Ma et al., presented at International $M^2S$-HTSC Conference, Stanford University, Jul. 23-26, 1989, to be published in Physica C.

Rapid Thermal Annealing of YBaCuO Thin-Films Deposited on $SiO_2$ Substrates, O. Y. Ma et al., J. Appl. Phys. 66 p. 1866 (1989).

Prospects for Applications of High-Temperature Superconductors, T. Van Duzer, Proceeding of 2nd Workshop on High Temperature Superconducting Electron Devices, Jun. 7-9, 1989 in Japan.

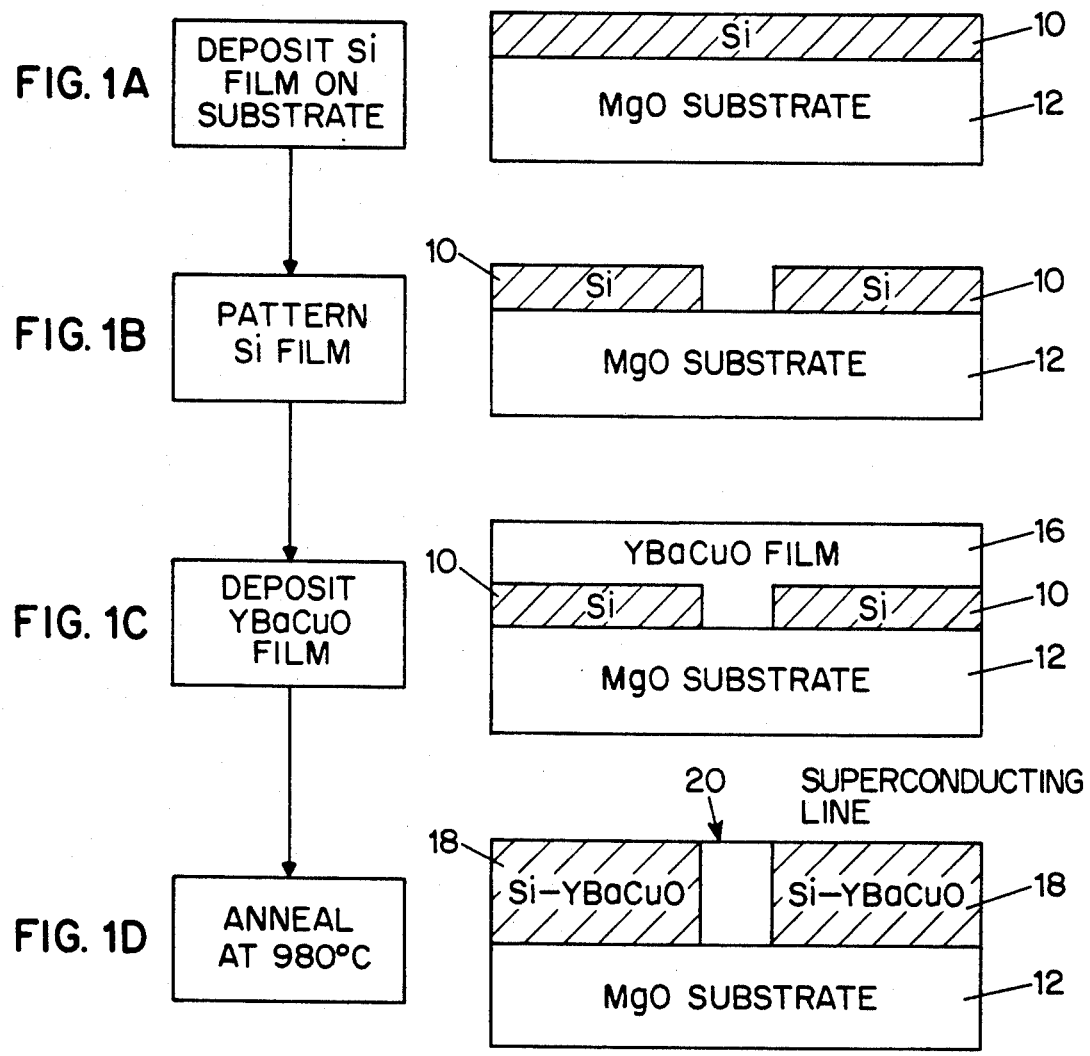

— 10 um

———— 25 um

METHOD OF PATTERNING SUPERCONDUCTING FILMS

BACKGROUND OF THE INVENTION

This invention was made with Government support under Contract No. N0014-86-K-0694 awarded by the Office of Naval Research.

This invention relates generally to superconducting thin films and, more particularly, to a method for patterning a thin film of superconducting material.

Since the discovery of high Tc superconductors, there has been increasing interest in the development of techniques for patterning thin film superconducting materials, particularly YBaCuO, for device fabrication. This is evidenced by the published papers listed in Information Disclosure Statement submitted by applicants, the disclosures of which are hereby incorporated herein by reference, which describe techniques for fabrication of thin films of high transition temperature superconducting materials and methods for patterning such films. The patterning methods most commonly used heretofore have utilized both wet and dry processes. The known wet processes include lift-off, ion or electron beam irradiation, chemical etching, and laser direct-writing, all of which involve removal of material using chemical solutions, which, because the superconductor material is sensitive to water and chemicals, may possibly damage the superconductor surfaces. The known dry processes of laser ablation or laser-reactive patterning are limited by the area of the localized laser beam.

Accordingly, it is an object of the present invention to provide an improved method for patterning thin film superconducting materials. Another object of the invention is to provide a method for forming a patterned superconducting oxide film on a substrate using a combination of well-developed semiconductor patterning techniques and laser direct-write etching. A further object of the invention is to provide a simple, chemical free, and relatively rapid method of patterning high $T_c$ superconducting films. Yet another object of the invention is to provide a method for patterning superconducting films that can be combined with known processing technology for manufacturing superconducting interconnects, electrodes of semiconductor devices, and Josephson junction type structures or superconductor quantum interference devices (SQUID).

SUMMARY OF THE INVENTION

Briefly, the inventive method of patterning thin superconductivity films is based on the inhibition of superconductivity by intermixing an impurity, by diffusion, for example, with the superconductor material. In practicing the method for patterning thin film superconducting YBaCuO, a thin film of silicon (Si) is first evaporated on a substrate of magnesium oxide (MgO), for example, and the Si film then is patterned using laser direct-write etching. Multilayered YBaCuO thin films are then deposited over the patterned Si film by e-beam evaporation and annealed in a rapid thermal annealing system for a period of thirty to ninety seconds at a temperature of 980° C. Because of diffusion of Si into the YBaCuO in the regions where the YBaCuO film contracts the silicon, the regions become insulating so as to form therebetween narrow lines of superconducting YBaCuO corresponding to the line pattern etched in the thin silicon film.

Other objects, features and advantages of the method, and a better understanding of how it is carried out, will be had from the following detailed description, taken in conjunction with the accompanying drawings.

BRIEF DESCRIPTION OF THE DRAWINGS

FIGS. 1A to 1C are schematic cross-sectional views illustrating evolutionary steps of the method for patterning YBaCuO thin films;

DESCRIPTION OF THE PREFERRED EMBODIMENTS

The method for patterning superconducting thin films according to the invention will be described with reference to FIGS. 1A to 1C which illustrate the steps of forming a line of superconducting YBaCuO on a MgO substrate. First, a thin layer 10 of silicon, having a thickness in the range between 500Å and 1000Å, is evaporated on a magnesium oxide (MgO) substrate 12 by electron-beam deposition at a base pressure $8 \times 10^{-8}$ Torr. Next, the Si film is patterned into fine line structures, one of which lines is shown in cross-section at 14, using laser etching, such as the focused laser etching technique described in detail by D. J. Ehrlich, R. M. Osgood, Jr., and T. F. Deutsch in *Appl. Phys. Lett.* 38, page 1018 (1981), and by G. V. Treyz, R. Beach, and R. M. Osgood, Jr., *Appl. Phys. Lett.* 50, page 475 (1987). This etching process is based on a laser-induced pyrolytic reaction of silicon with chlorine gas. The silicon coated substrate is placed in a reaction chamber which is evacuated to a pressure of 10 m Torr, before filling with chlorine typically to a pressure of 300 Torr. The line structure is patterned by scanning a focused argon-ion laser beam, which has a wavelength of 514 nm, across the surface of the silicon film at a scan speed of 100 μm/second; laser power of about 2.0 watts at the film surface is typical. The laser beam is focused, with a 10x microscope objective, for example, to a spot size of 2.5 μm FWHM, this small spot size producing a laser intensity sufficiently large to melt the silicon surface in a highly localized region. Significant etching occurs only on the area of the surface that is melted.

Next, as schematically illustrated in FIG. 1C, a multilayered structure 16 of copper, barium oxide and yttrium oxide is deposited over the patterned silicon film by e-beam evaporation of Y, Ba, and Cu in sequence with a base vacuum of low $10^{-7}$ Torr. The first two layers of $Y_2O_3$ and BaO are deposited in the presence of an oxygen partial pressure of $10^{-4}$ Torr. The thicknesses of the layers typically are about 1000, 2400 and 900Å $Y_2O_3$, BaO, and Cu, respectively, which would give a composition of $YBa_2Cu_3O_{7-x}$ if fully oxidized. A detailed description of the deposition procedure, as well as the composition determination, appear in a paper by C. A. Chang, C. C. Tsuei, C. C. Chi and T. R. McGuire published in *Appl. Phys. Lett.* 52, page 72 (1988).

Figure 2A:
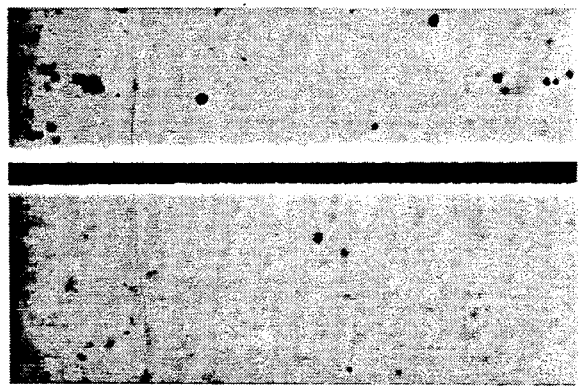
FIG. 2A is a photomicrograph showing a 10 μm wide line structure patterned on silicon film by laser direct-writing etching.
Figure 2B:
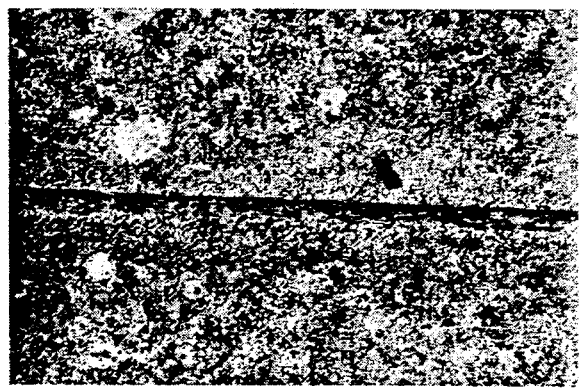
FIG. 2B is a photomicrograph showing the same line after deposition of YBaCuO film and annealing at 980° C. for forty-five seconds.

As a final step, shown in FIG. 1D, the sample is post-annealed using rapid thermal annealing (RTA) in flowing helium or oxygen at atmospheric pressure. Suitable apparatus for performing this annealing step is a Heat Pulse model 210T-02 with temperature control mode; the typical temperature profile of this mode includes a rapid heating up (20 seconds) by infrared radiation, a constant temperature period of 1 to 3 minutes and then a ramp down to 200° C. in 5 minutes. It has been observed that flowing helium gas during heating and the first half of the constant temperature period, followed by oxygen flowing for the rest of the cycle, yields the best superconducting films. The sample quality varies with different annealing temperatures and times; in general, YBaCuO films on MgO substrates with RTA temperature between 950 and 1000° C. for 1 to 3 minutes will result in superconductivity. In the present method the temperature was kept at 980° C. for 30 to 90 seconds. The rapid thermal annealing causes the silicon to intermix with the YBaCuO in the silicon regions causing these regions to become insulating, and to form a narrow YBaCuO superconducting line 20 between the insulating regions 18. The annealing step not only changes the electrical characteristics of specific regions, but its physical appearance as well; the regions 18 where the silicon is mixed with YBaCuO appears light gray and slightly transparent, whereas the region without silicon, i.e., the superconducting line, turns dark black. The micrograph of FIG. 2A shows a 10 µm wide line etched on silicon by laser writing and the micrograph of FIG. 2B shows the same line after YBaCuO film deposition and annealing.

Figure 3:
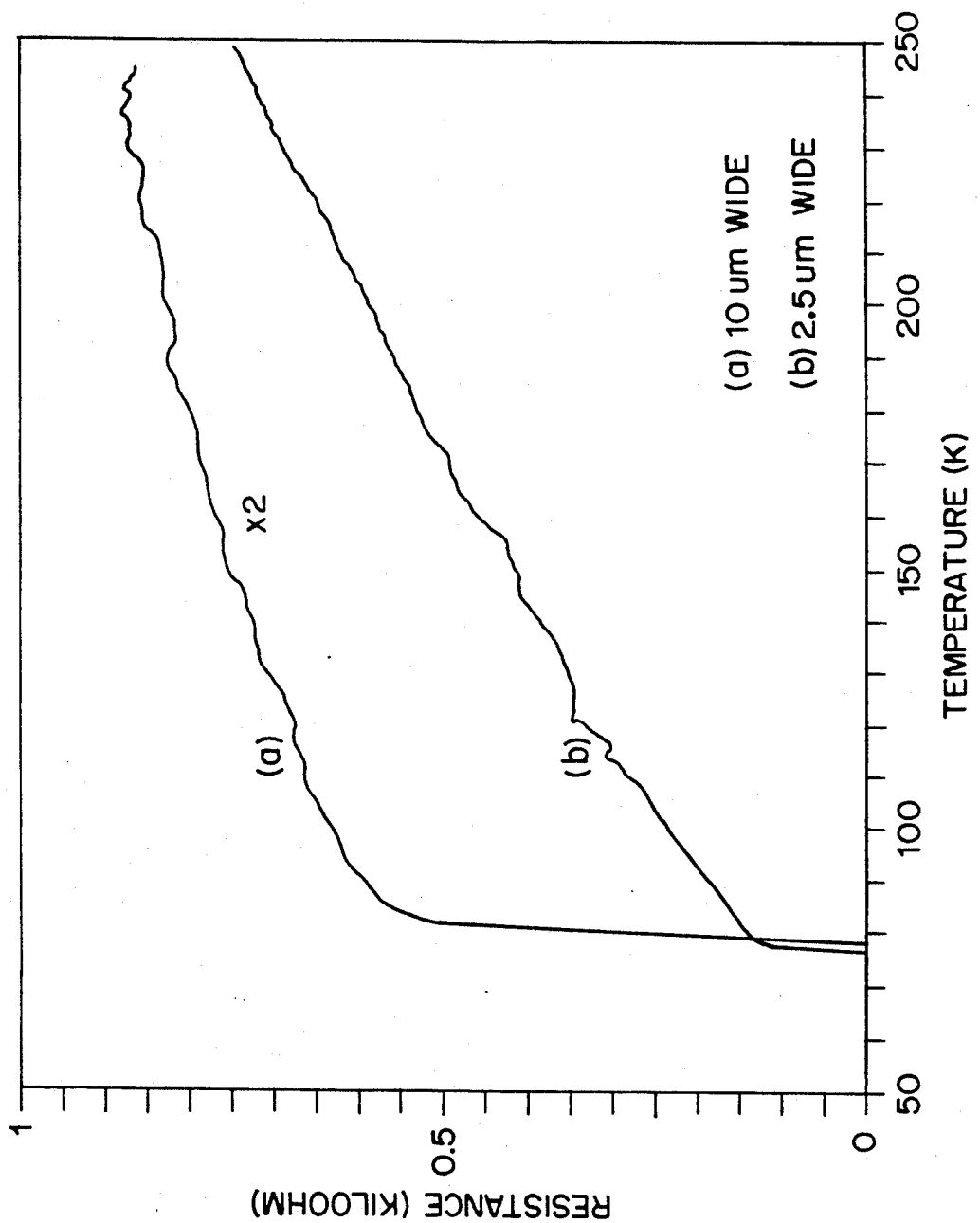
FIG. 3 is a set of curves showing the temperature dependence of resistance for superconducting lines of two different widths.

When the electrical properties of the patterned film is characterized by standard four-point probe measurement, the resistivity of the film without silicon is typically 2 to 7 mΩcm. Superconductivity was observed in these regions of the film as well as in the line structures. FIG. 3 shows the resistivity versus temperature measurement for two typical superconducting YBaCuO lines annealed at 980° C. for 45 seconds. FIG. 3(a) shows that for a 10 µm wide and 1 mm long line, the superconducting transition begins at 82K and completes at 78K; the room temperature resistance is in the order of kilohms due to the geometry of the sample. With a narrow line 2.5 µm wide and 80 µm long, the $T_c$ is slightly lower (76K) than that of the 10 µm wide line, as shown in FIG. 3(b). The critical current density for both lines was determined to be 300A/cm² by the transport measurement described by P. Chaudhari et al. in *Phys. Rev. Lett.* 58, page 2684 (1987). In contrast, the film with underlying silicon becomes insulating after annealing, typically having a resistance greater than 20 megohms.

Figure 4:
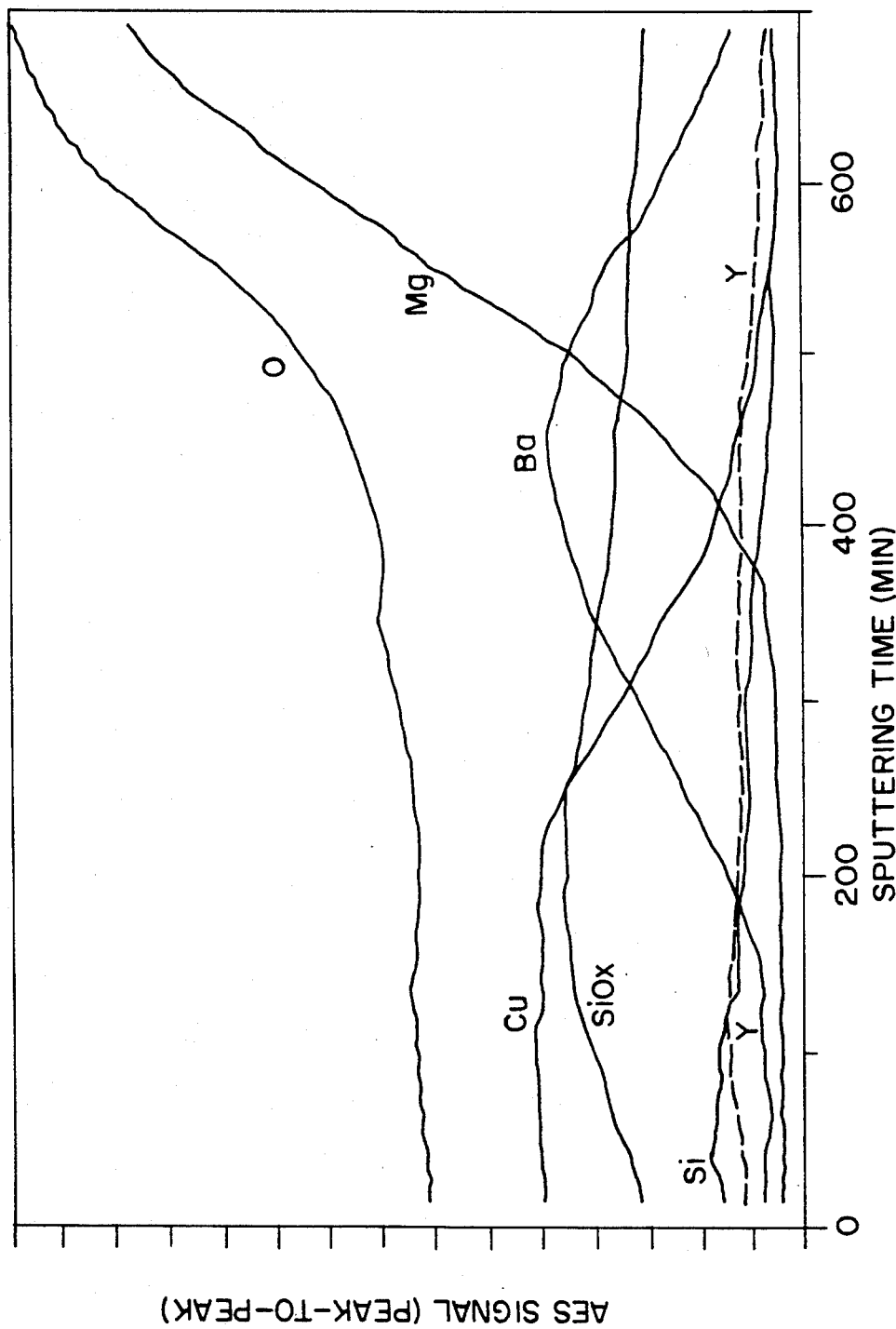
FIG. 4 is a set of curves showing the Auger electron spectroscopy (AES) depth profile of a Si-YBaCuO intermixed film deposited on a MgO substrate.

That the regions where the YBaCuO film was deposited on silicon were completely intermixed and insulating throughout the film was confirmed by Auger electron spectroscopy (AES) depth profiling. FIG. 4 shows the AES depth profile for a sample with 980° C. 45s RTA. It will be noted that the silicon signal is very small compared with the silicon oxide signal, indicating that the silicon has diffused throughout the entire film to form silicon oxide during the oxygen annealing; it is the silicon oxide that causes the intermixed film to become insulating.

Figure 5A:
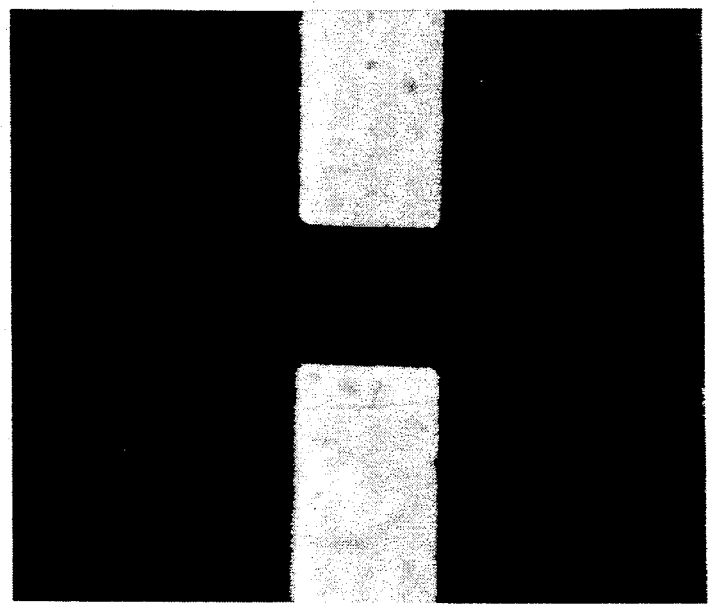
FIGS. 5A and 5B are photomicrographs showing steps in the fabrication of a Josephson junction type structure respectively showing a patterned Si film on a MgO substrate and the structure after deposition of a YBaCuO film and annealing.
Figure 5B:
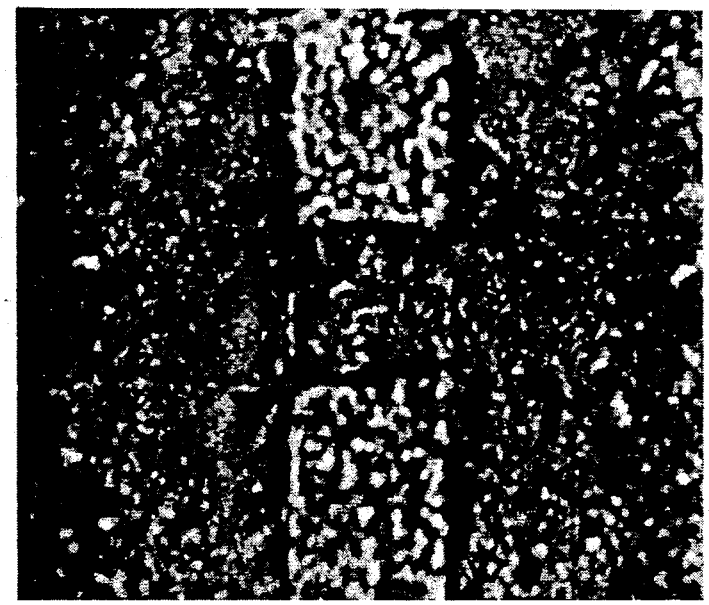

In addition to being useful for the production of superconducting lines on MgO substrate, the described patterning technique can be used, for example, for making DC and AC Josephson junction type structures. FIG. 5A is a photomicrograph of a junction bridge having a 25 µm gap with 25 µm bridge patterned by photolithography on silicon; the white regions are the patterned Si and the dark areas are the MgO substrate. FIG. 5B is a photomicrograph of the junction after deposition of multilayered YBaCuO thin films and annealing in a rapid thermal annealing system.

The described method can be extended to use a silicon instead of a MgO substrate. As described in applicants' articles entitled "Interdiffusion between Si substrates and YBaCuO films" presented at International $M^{25}$-HTSC Conference held at Stanford University on July 23-26, 1989, to be published in Physica C. and "Rapid Thermal Annealing of YBaCuO Thin Films Deposited on SiO2 Substrates," *J. App. Phys.*, Aug. 15, 1989, applicants have grown YBaCuO superconducting film on silicon with either $SiO_2$ or noble metal (gold or silver) buffer layers. By patterning these buffer layers, the same Si-YBaCuO intermixing idea can be employed to form superconducting interconnects on silicon substrates for reducing both power dissipation and time delays in electronic systems.

Figure 6A:
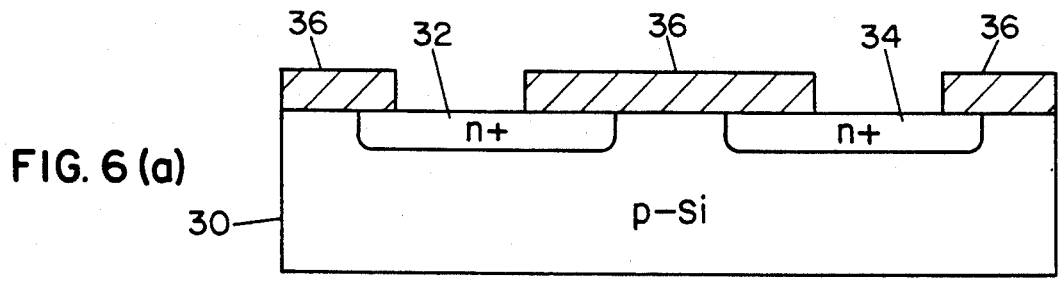
FIGS. 6(a) to 6(c) are schematic cross-sectional views showing the fabrication of a semiconductor device with superconducting interconnects.
Figure 6B:
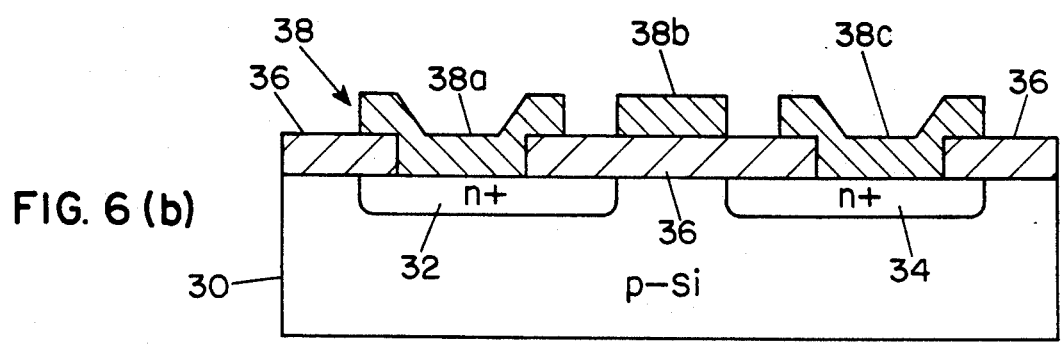
Figure 6C:
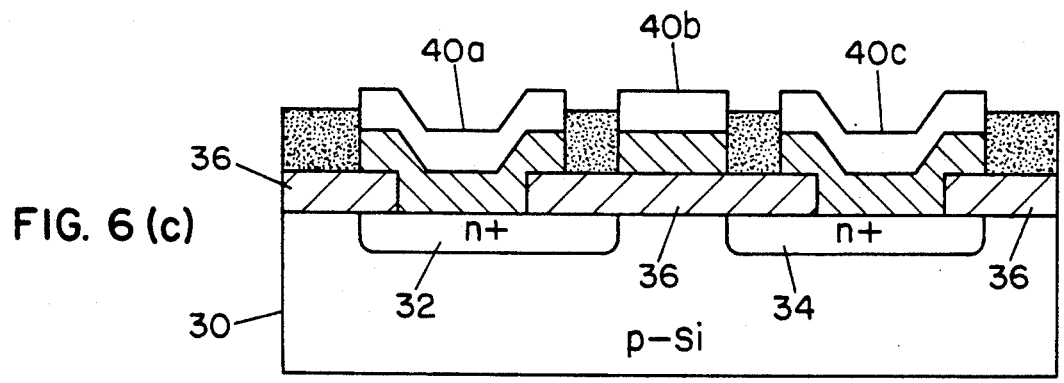
Figure 6D:
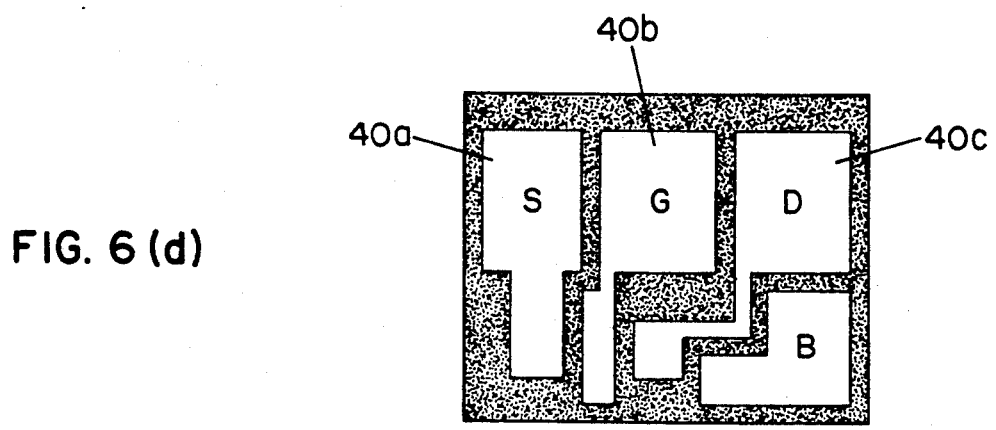
FIG. 6(d) is a plan view of the device.

A first application of the extension of this invention to silicon substates is to make superconducting interconnects as electrodes of semiconductor devices, illustrated in FIGS. 6(a), to 6(d). FIG. 6(a), shows a conventional Metal-Oxide-Semiconductor Field Effect Transistor (MOSFET) structure, wherein a p-type silicon substrate 30 is used as the n-channel material and two doped n-type silicon areas 32 and 34 serve as source and drain, respectively. The $SiO_2$ layer 36 is grown and patterned in conventional manner and provides a gate dielectric layer. Next, as shown in FIG. 6(b), a buffer layer 38 of noble metal such as gold is deposited over the patterned $SiO_2$ layer, and this buffer layer is then patterned by lithography so as to leave small areas 38a, 38b and 38c over the source, gate and drain regions, respectively. Next, a film 40 of superconducting material, such as YBaCuO, is deposited by e-beam evaporation over the entire device, followed by annealing, preferably using RTA. The three regions 40a, 40b and 40c, where the superconducting film overlies the buffer layer regions 38a, 38b and 38c, become superconductive and can e used as source, gate and drain electrodes, respectively. The regions where the superconducting film directly contacts the $SiO_2$ layer 36 are insulating after the annealing step due to diffusion of silicon from the substrate into the superconducting film; these regions are characterized by stippling in FIG. 6(c). FIG. 6(d) is a top view of a device constructed in accordance with the above-described method, in which the letters S, G, and D stand for source, gate and drain electrodes, and B is the electrode for backside contact.

Figure 7:
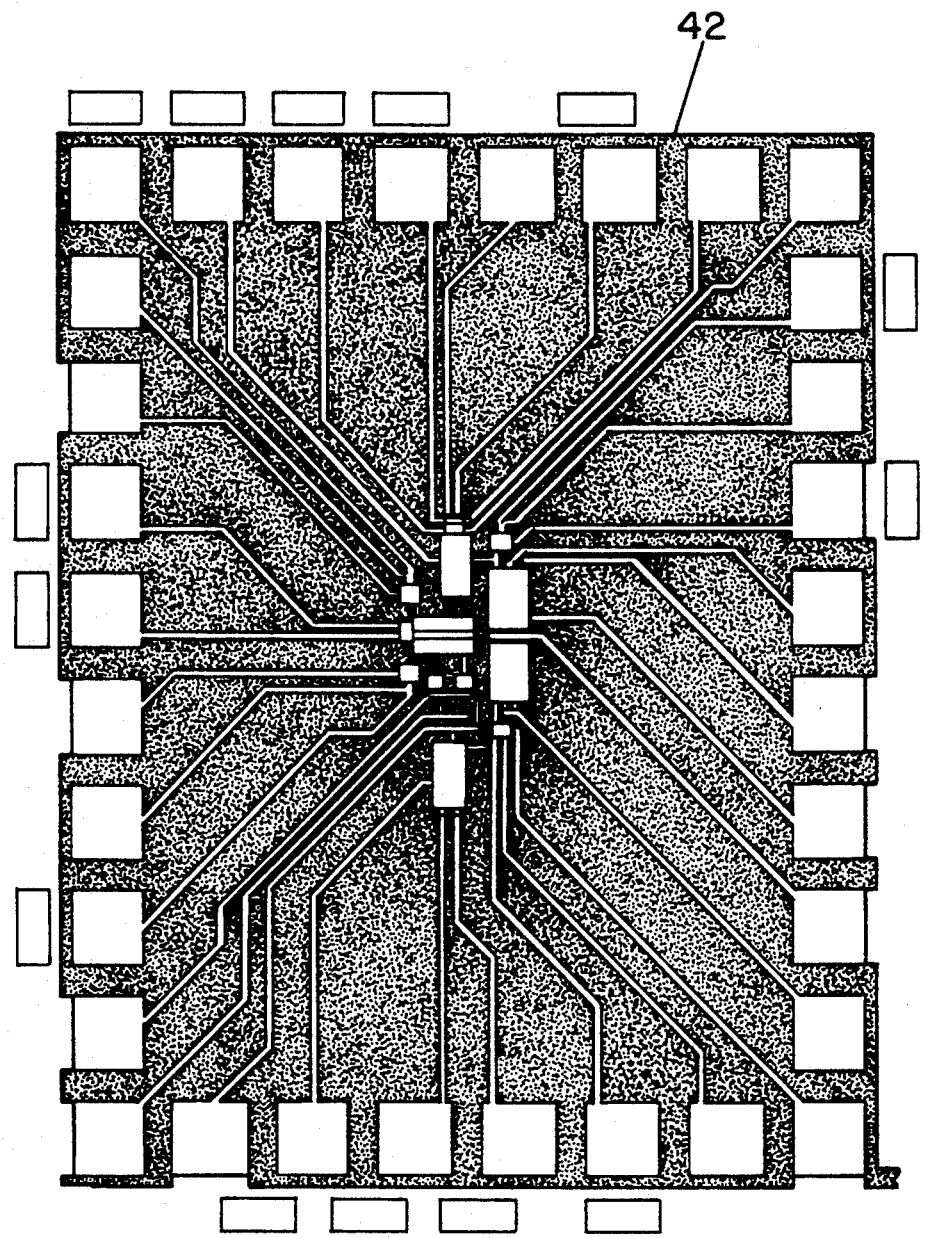
FIG. 7 is a plan view of a large scale integrated circuit.

The method according to the invention can also be used to replace the large scale metal interconnects in semiconductor integrated circuits with superconducting interconnects. A typical IC contains many devices (transistors, diodes, etc.) fabricated on a single silicon wafer and many metal lines, or paths, to interconnect these devices; using the above described inhibition idea, these metal interconnects can be replaced by paths of superconducting material. FIG. 7 shows an example of an IC on a silicon wafer 42 in which all of the white lines and pads are metal interconnects. In applying the present patterning method a buffer layer of gold or silver deposited on the silicon wafer is patterned in the same configuration as the white lines. Next, a film of superconducting material, such as YBaCuO, is deposited over the entire wafer, and when this layer is rapidly annealed superconducting interconnects with the same pattern are formed. For IC devices requiring a low temperature process for their fabrication, the superconducting interconnects can be made prior to the device fabrication. As described in applicants' paper entitled "High $T_c$ superconducting films by rapid thermal annealing of Cu/BaO/Y$_2$O$_3$ layered structures", *Appl. Phys. Lett*, Vol 53, p. 2229, 1988, applicants have found that the contact between gold or silver and superconductor material exhibits very low contact resistance; this allows making device electrodes, of gold, in direct contact with the superconducting interconnects without affecting the IC performance.

The described technique for defining interconnects can also be extended to board level integration of devices. For board level superconducting interconnects, all of the devices would have to be cooled to liquid nitrogen temperature for superconductor operation. This would, in fact, provide an advantage over room temperature operation, since silicon devices have a faster speed of operation at liquid nitrogen temperature.

Although the invention has been described and illustrated in detail, it is to be understood that the same is by way of illustration and example only and is not to be taken by way of limitation, since it will now occur to one skilled in the art that the described parameters of the patterning process may e amenable to modification without departing from the true spirit of the invention.

We claim:

1. A method for making superconducting interconnects and electrodes of a semiconductor device, comprising the steps of:
   (a) providing a substrate of silicon of first conductivity type having at least one area of opposite conductivity type silicon formed in its upper surface;
   (b) forming over said substrate a thin film of a first material which when interacted with high $T_c$ superconductor material destroys the superconductivity thereof and patterning said film to expose at least a portion of said at least one area of opposite conductivity type silicon;
   (c) depositing a thin film of noble metal over the pattern formed in said film of first material;
   (d) patterning said metal film to leave areas of metal over at least a portion of each said at least one area of opposite conductivity type silicon;
   (e) depositing over the patterned metal film a thin film of high $T_c$ superconductor material; and
   (f) annealing said substrate and the films deposited thereon at a temperature and for a time sufficient to cause aid first material to interact with said high $T_c$ superconductor material and render insulating the regions thereof disposed between said areas of metal and causing the regions of high $T_c$ superconductor material which overlie said areas of metal to become superconductive.

2. The method as defined in claim 1, wherein said first material is silicon.

3. The method as defined in claim 1, wherein said first material is silicon dioxide.

4. A method for making superconducting interconnects and source, gate and drain electrodes of a metal-oxide-semiconductor field effect transistor (MOSFET), comprising the steps of:
   (a) providing a substrate of silicon of first conductivity type having first and second separated areas of silicon of opposite conductivity type formed in its upper surface which serve as source and drain, respectively;
   (b) forming over the upper surface of said substrate a thin film of silicon dioxide (SiO$_2$) patterned to expose at least a portion of each of said areas of opposite conductivity type silicon;
   (c) depositing a thin film of noble metal over said patterned SiO$_2$ film;
   (d) forming in said film of noble metal a pattern consisting of first and second small areas of metal over said source and drain regions and a small area therebetween over a gate region;
   (e) depositing over the patterned film of noble metal a thin film of high $T_c$ superconductor materials; and
   (f) annealing said substrate and the films deposited thereon at a temperature and for a time sufficient to render insulating the regions of superconductor material disposed between said small areas of metal due to interaction of silicon with said high $T_c$ superconductor material while retaining the superconductivity of the regions of superconductor material which overlie said small areas of metal.

5. A method as defined in claim 4, wherein said superconductor material is YBaCuO and is annealed by rapid thermal annealing at a temperature of 980° C. maintained for a period in the range from about 30 seconds to about 90 seconds.

6. A method for making superconducting interconnects and electrodes of a semiconductor device, comprising the steps of:
   (a) providing a substrate of silicon of first conductivity type having at least one area of opposite conductivity type silicon formed in its upper surface;
   (b) forming over said substrate a thin film of silicon dioxide (SiO$_2$) which when interacted with high $T_c$ superconductor material destroys the superconductivity thereof patterned to expose at least a portion of said at least one area of opposite conductivity type silicon;
   (c) depositing a thin film of metal selected from the group consisting of silver and gold over the pattern formed in said (SiO$_2$) film;
   (d) patterning said metal film to leave areas of metal over at least a portion of each said at least one area of opposite conductivity type silicon;
   (e) depositing over the patterned metal film a thin film of high $T_c$ superconductor material; and
   (f) annealing said substrate and the films deposited thereon at a temperature and for a time sufficient to cause said silicon dioxide (SiO$_2$) to interact with said high $T_c$ superconductor material and render insulating the regions thereof disposed between said areas of metal and causing the regions of high $T_c$ superconductor material which overlie said areas of metal to become superconductive.

* * * * *